United States Patent [19]

Taylor

[11] 4,398,270

[45] Aug. 9, 1983

[54] SELF-LOADING BOOTSTRAP CIRCUIT

[75] Inventor: Ronald T. Taylor, Irving, Tex.

[73] Assignee: Mostek Corporation, Carrollton, Tex.

[21] Appl. No.: 300,609

[22] Filed: Sep. 9, 1981

[51] Int. Cl.³ .............................................. G11C 11/40
[52] U.S. Cl. .................................... 365/203; 307/463
[58] Field of Search .......................... 365/203; 307/463

[56]         References Cited
           U.S. PATENT DOCUMENTS
   4,318,014  3/1982  McAllister et al. .................. 365/203

Primary Examiner—Terrell W. Fears

[57]                ABSTRACT

The input/output lines (12, 14) of a semiconductor memory device are equilibrated up until the time of the read operation by a field effect transistor (24). The source and drain terminals of the transistor are connected to the input/output lines (12, 14), and the gate is controlled by an equilibration circuit (28). The equilibration circuit (28) includes a bootstrap capacitor (40) charged to the bootstrap voltage level by the self-timing action of the equilibration circuit (28) in response to a single precharge clock signal. Feedback from the output node (26) of the equilibration circuit (28) releases a Schmitt trigger circuit to allow the capacitor (40) to be pulled to the bootstrap level by the precharge clock signal. A pump circuit (30) maintains the voltage level at the output node (26) of the equilibration circuit (28) during periods of long inactivity between column address strobes.

4 Claims, 2 Drawing Figures

SELF-LOADING BOOTSTRAP CIRCUIT

TECHNICAL FIELD

The present invention pertains to an integrated circuit to precharge the input/output lines of a semiconductor memory device, and more particularly to a self-loading bootstrap circuit for equilibrating the input/output lines of a semiconductor memory device.

BACKGROUND ART

The input/output lines of a dynamic random access memory (RAM) device carry the data from the data in and data out circuits to the bit lines of the memory matrix. During a read operation using balanced sensing, the input/output and input/output lines must be kept at identically the same voltage up until the time they are read. The prior practice for equilibrating the input/output lines involved precharging the lines with a precharge clock signal. The precharge clock signal was bootstrapped above the supply voltage such that the input/output lines were equilibrated to the supply voltage level.

The use of the bootstrapped precharge clock signal to bootstrap the input/output lines above supply voltage has a drawback with some dynamic RAM's, because the bootstrapped clock signal can leak off due to junction leaksge, subthreshold conduction or a number of other problems in the circuit. In addition, after the input/output lines are precharged and the precharge transistors driving the clock signal turn off, the lines are no longer equilibrated if any differential noise comes along on the supply voltage.

A need has thus arisen for an improved circuit to keep the input/output lines at the identical voltage level up until the time these lines are sensed during the read operation.

DISCLOSURE OF THE INVENTION

In accordance with the present invention, a self-loading bootstrap equilibration circuit maintains the input/output lines at the identical voltage up until the precise time the read operation occurs. A field effect transistor has its source and drain terminals connected to the input/output and input/output lines, and its gate is the load of the equilibration circuit. The equilibration circuit of the present invention maintains these input/output lines at an identical voltage with only a single precharge clocking signal. After the column decoder precharge signal has shut off, the gate to the field effect transistor connected to the input/output lines is isolated at a bootstrap level so there is still equilibration between these lines. The equilibration circuit is self-timed such that a capacitor which bootstraps the gate of the transistor to the input/output lines above the supply voltage is charged from a single precharge clock signal.

BRIEF DESCRIPTION OF DRAWINGS

For a complete understanding of the present invention and the advantages of the features thereof, reference is now made to the accompanying Detailed Description taken in conjunction with the following figures in which.

DETAILED DESCRIPTION

Figure 1:
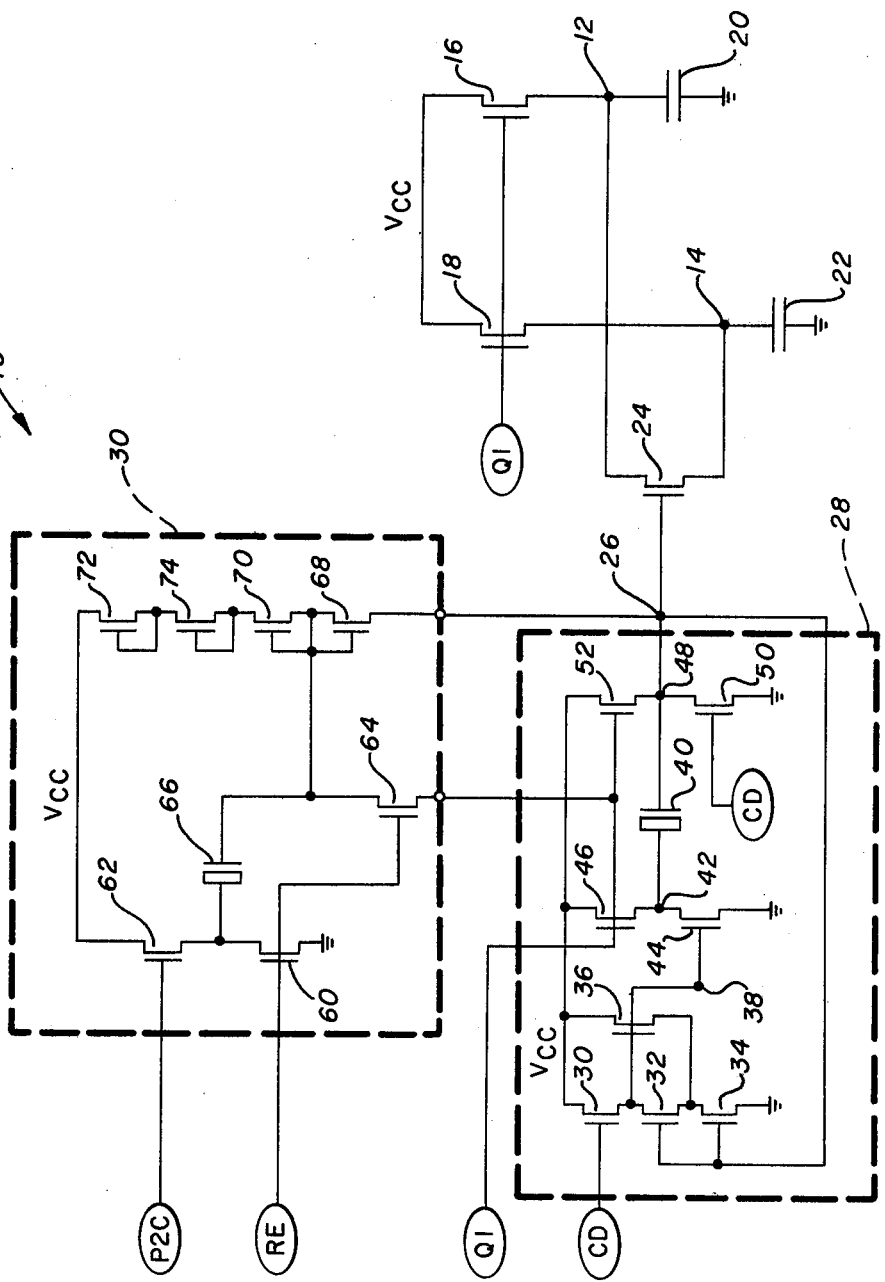
FIG. 1 is a circuit drawing illustrating the equilibration circuit of the present invention.

FIG. 1 illustrates the circuit arrangement of the present invention, generally identified by the reference numeral 10, for providing for the equilibration of the input/output lines of a semiconductor memory device. The circuit 10 may be utilized on a dynamic random access memory, such as a 16 K by one dynamic RAM manufactured by Mostek Corporation and identified as MK4516. The input/output line 12 and the input/output line 14 carry the data from the data in or data out circuits out through the bit lines. Balanced sensing is used during the read operation, making it essential that the input/output lines 12 and 14 are kept at identically the same voltage up until the time they are read. The circuit 10 is basically a Column Address Strobe (CAS) function.

Precharge transistors 16 and 18 have their gates connected to a precharge clock signal "$Q_1$", and the source terminals of these field effect transistors 16 and 18 are connected to the supply voltage for the integrated circuit. The drain terminal of the transistor 16 is connected to the input/output line 12, and the drain terminal of the transistor 18 is connected to the input/output line 14. The input/output lines 12 and 14 are connected to capacitance represented as capacitors 20 and 22, respectively, where the capacitance is the summation of various capacitance in the circuit, such as the overlap capacitance, diode capacitance, and metallization capacitance.

A field effect transistor 24 has its source terminal connected to the input/output line 12, and its drain terminal connected to the input/output line 14. The gate of the field effect transistor 24 is connected to the output node 26 of the self-loading bootstrap equilibration circuit 28, illustrated enclosed within dashed lines. The circuit 10 also includes a pumping circuit 30, also shown within dashed lines, for maintaining the necessary voltage level at the node 26 and gate of transistor 24 if no Column Address Strobe (CAS) cycle is present.

The self-loading bootstrap equilibration circuit 28 includes a Schmitt trigger circuit consisting of field transistors 30, 32, 34 and 36. The Schmitt trigger output node 38 is precharged through the column decode clock signal "CD" applied to the gate of transistor 30. The equilibration circuit node output node 26 is fed back around into the release of the Schmitt trigger circuit through the gates of transistors 32 and 34. The source terminals of transistors 30 and 36 are connected to the voltage supply, Vcc, of the circuit.

A bootstrap capacitor 40 has a first terminal 42 connected between the source and drain terminals of field effect transistors 44 and 46. The gate of transistor 44 is controlled by the voltage level at the Schmitt trigger output mode 38, and its drain terminal is tied to ground. The gate of transistor 46 is controlled by voltage level of the precharge clock "$Q_1$," and its source terminal is connected to voltage supply Vcc. The second terminal 48 of capacitor 40 is connected between the source and drain terminals of field effect transistors 50 and 52. Transistor 50 is controlled by the column decode clock signal "CD" applied to its gate terminal, and its drain terminal is connected to ground. The transistor 52 has its gate controlled by precharge clock signal "$Q_1$," and its source terminal is tied to Vcc.

Row clocks, "RE" and "P2C," drive the pump circuit 30 through the gates of interconnected field effect transistors 60 and 62. The RE clock signal also drives the gate of a field effect transistor which has its drain terminal connected to the gates of transistors 46 and 52. The source of transistor 64 is connected to a capacitor 66 between the source of transistor 64 and the interconnected transistors 60 and 62. One terminal of the capacitor 66 is connected to the gates of interconnected field effect transistors 68 and 70 as well as to the node between interconnected transistors 68 and 70. The source of transistor 62 is connected to the voltage supply Vcc, as is the source of a transistor 72. The transistor 72 has its drain terminal fed back to its gate and connected to the source of a field effect transistor 74, which also has the output from its drain terminal fed back through its gate. The drain terminal of the transistor 74 is also connected to the source of transistor 70.

Figure 2:
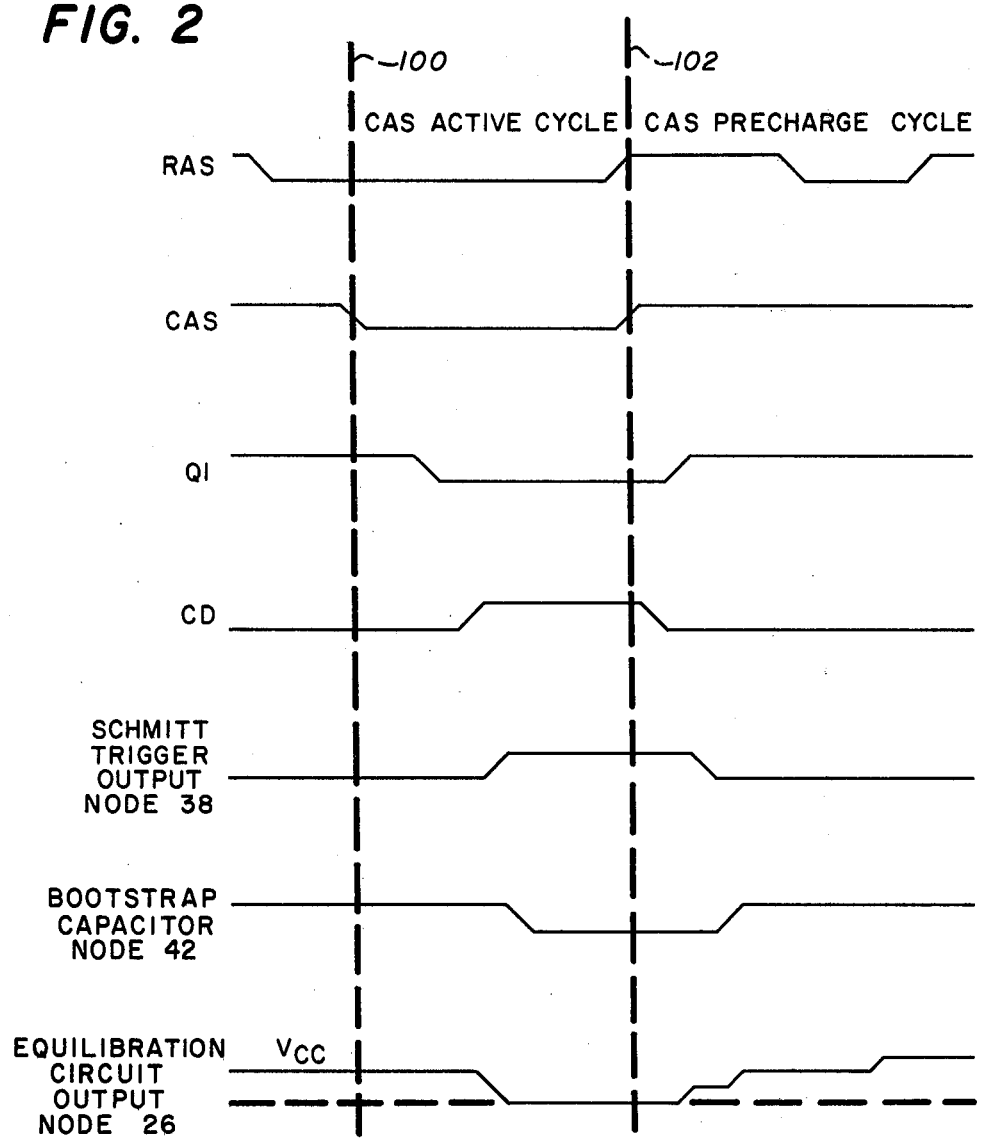
FIG. 2 is a timing diagram for the equilibration circuit of FIG. 1.

FIG. 2 is a timing chart for explaining the operation of the circuit 10 illustrated in FIG. 1. The timing signals illustrated in FIG. 2 include the Row Address Strobe (RAS), the Column Address Strobe (CAS), the precharge clock signal "$Q_1$," the colum decode clock signal "CD," the Schmitt trigger output node 38, the first bootstrap capacitor node 42, and the equilibration circuit output node 26.

The operation of the circuit 10 of the present invention is basically a CAS function. The precharge clock signal "$Q_1$" is essentially a delayed CAS waveform, since when CAS is high the column clocks are in the precharge condition. "CD" is a delayed CAS clock signal. After a period of time after CAS goes low, "CD" goes high and is reset to the low state when CAS goes high. "CD" is the clock signal that actually connects the bit lines of the memory matrix to the input/output lines 12, 14.

The CAS active cycle begins at time 100 and extends to time 102 on the waveform diagram of FIG. 2. The CAS precharge portion of the cycle begins at the time 102. As the active CAS cycle begins, the first thing that happens is that the CAS goes low. CAS goes low after the RAS activity has occurred. Some period of time after CAS goes low, the precharge clock signal $Q_1$ also goes low and none of the nodes of the circuit actually change at that time. The bootstrap capacitor node 42 remains high, the equilibration circuit output node 26 remains at the bootstrap level, but now these nodes are isolated. The nodes 26 and 42 are isolated by the shut-off of transistors 46 and 52 at which time the transistors 44 and 50 are also shut-off. Thus, even though the precharge clock "$Q_1$" has been shut-off to the input/output and input/output lines 12 and 14, the equilibration circuit output node 26 is still isolated at a bootstrap level to maintain equilibration between the lines.

The equilibrium between the input/output lines is to be removed at the precise instant that column decode "CD" signal goes high. When the "CD" goes high it connects the input/output lines 12 and 14 and the bit lines at which precise time the equilibration is removed. The equilibration of the input/output lines is removed by transistor 50 being turned on when the "CD" goes high, which pulls the output node 26 to ground to remove the equilibration. A very short delay later, the "CD" signal also precharges the Schmitt trigger circuit through the transistor 30 to pull the output node 38 high and source follower transistor 44 discharges the bootstrap capacitor node 42 to ground, which completes the action of the circuit during the active CAS cycle.

During the CAS precharge cycle beginning at time 102, CAS goes high forcing the "CD" signal low to isolate the bit lines in the matrix. As "CD" goes low the transistor 50 is shut off again isolating the equilibration output node 26. As "CD" goes low, it also shuts off the precharge of the Schmitt trigger at the gate of the transistor 30. After "CD" has gone low, the precharge clock signal "$Q_1$" returns to the high state and precharges the equilibration output node 26 to $V_{cc} - V_T$ level through transistor 52. "$Q_1$" also attempts to turn on transistor 46 to pull up bootstrap node 42, but this is delayed because the transistor 44 is still on. After the output node has reached a certain predetermined voltage, e.g., four volts in the MK4516, it is fed back around into the release of the Schmitt trigger circuit at the gates of transistors 32 and 34. The feedback of the output from the node 26 to the Schmitt trigger circuit provides the self-timed action of the equilibration circuit. As the output node 26 comes up in voltage from "$Q_1$," it will eventually force the Schmitt trigger node 38 low by turning on the transistors 32 and 34. When the Schmitt trigger node 38 goes low, then the transistor 44 is shut off and the transistor 46 now pulls the bootstrap node 42 the rest of the way up to $V_{cc} - V_T$. When this occurs, the bootstrap capacitor 46 will bootstrap the output node 26 up above the supply voltage. The boot strap is self-timed, the pull-off action of the circuit occurs exactly when you need it, i.e., when column decode signal "CD" goes high. Since the equilibration circuit 28 contains only column clocks, it is a function only of CAS action and is applicable to page mode operations as well as normal operation.

Although one embodiment of the invention has been illustrated in the accompanying Drawings and described in the foregoing Detailed Description, it will be understood that the invention is not limited to the embodiment disclosed, but is capable of numerous rearrangements, modifications and substitutions without departing from the scope of the invention. Any circuit requiring the equilibration of two nodes such as 12 and 14 is a potential application for this circuit. Examples include equilibrated static RAMS, ROMS and sample and hold circuits.

I claim:

1. A circuit for equilibrating the voltage level on the input/output lines of a semiconductor memory device for a read operation, comprising:
   means for precharging the input/output lines in response to a precharge clock signal;
   a first field effect transistor having its source and drain terminals connected to the input/output lines;
   means for precharging a bootstrap capacitor to a predetermined bootstrap voltage level in response to a single precharge clock signal, the gate terminal of said first transistor being connected to said bootstrap capacitor for equilibrating the voltage on the input/output lines; and
   a second field effect transistor having its gate connected to the column decode signal, the drain terminal of said transistor connected to ground and the source terminal connected to the gate of said first transistor, whereby the equilibration of the input/output lines is removed in response to a column decode clock signal at the beginning of a read operation.

2. The circuit for equilibrating voltage level on the input/output lines of the semiconductor device for a read operation of claim 1 and further comprising:
   a pump circuit for maintaining the voltage level at the gate of said first field effect transistor during periods when there is no column address strobe activity.

3. The circuit for equilibrating the voltage level on the input/output lines of a semiconductor memory device for a read operation comprising:
   means for precharging the input/output lines in response to a precharge clock signal;
   a first field effect transistor having its source and drain terminals connected to the input/output lines;
   a Schmitt trigger circuit precharged by the column decode signal and released by the feedback from the gate of said first field effect transistor;
   second and third field effect transistors having their drain terminals connected to the terminals of said bootstrap capacitor, the source terminals of said second and third transistors connected to voltage supply, and said second and third transistors having their gates connected to the precharge clock signal to turn said second and third transistors on;
   a fourth field effect transistor having its source terminal connected to the node between the drain terminal of said second transistor and a terminal of said bootstrap capacitor, the drain terminal of said fourth transistor connected to ground and the gate of said fourth transistor connected to the output of said Schmitt trigger circuit, whereby the Schmitt trigger circuit is precharged by the column decode signal and released under the self-timed action of the voltage level of the gate of said first transistor to allow said bootstrapped capacitor to be raised to the bootstrap voltage level by a single precharge clock signal; and
   means for removing the equilibration of the input/output lines in response to a column decode clock signal at the beginning of a read operation.

4. The circuit for equilibrating voltage level on the input/output lines of the semiconductor device for a read operation of claim 3 and further comprising:
   a pump circuit for maintaining the voltage level at the gate of said first field effect transistor during periods when there is no column address strobe activity.

* * * * *